US010829004B1

(12) United States Patent
Han et al.

(10) Patent No.: US 10,829,004 B1
(45) Date of Patent: Nov. 10, 2020

(54) CONTINUOUS DERATING FAST CHARGING METHOD BASED ON MULTIPLE PARTICLE REDUCED ORDER MODEL

(71) Applicant: SF Motors, Inc., Santa Clara, CA (US)

(72) Inventors: Sangwoo Han, Mountain View, CA (US); Saeed Khaleghi Rahimian, San Jose, CA (US); Mehdi Forouzan, Santa Clara, CA (US); Ying Liu, Fremont, CA (US); Yifan Tang, Santa Clara, CA (US)

(73) Assignee: SF Motors, Inc., Santa Clara, CA (US)

(*) Notice: Subject to any disclaimer, the term of this patent is extended or adjusted under 35 U.S.C. 154(b) by 0 days.

(21) Appl. No.: 16/412,418

(22) Filed: May 15, 2019

(51) Int. Cl.
B60L 58/12 (2019.01)
H01M 10/44 (2006.01)

(52) U.S. Cl.
CPC ............. B60L 58/12 (2019.02); H01M 10/44 (2013.01); H01M 10/446 (2013.01)

(58) Field of Classification Search
CPC ...... B60L 58/12; H01M 10/44; H01M 10/446
USPC ........................................................ 429/120
See application file for complete search history.

(56) References Cited

U.S. PATENT DOCUMENTS

| 8,531,158 | B2 | 9/2013 | Wang et al. |
| 8,680,815 | B2 | 3/2014 | Wang et al. |
| 8,765,306 | B2 | 7/2014 | Amiruddin et al. |
| 9,231,282 | B2 | 1/2016 | Yebka et al. |
| 9,325,181 | B2 | 4/2016 | Momcilovich et al. |
| 9,472,962 | B2 | 10/2016 | Brun-Buisson et al. |
| 10,067,086 | B2 | 9/2018 | Genies et al. |
| 2009/0104510 | A1 | 4/2009 | Fulop et al. |
| 2009/0256528 | A1 | 10/2009 | Greening et al. |
| 2012/0007560 | A1 | 1/2012 | Smart et al. |
| 2016/0023566 | A1* | 1/2016 | Lee .................. B60L 11/1851 429/50 |
| 2016/0023568 | A1* | 1/2016 | Lee ...................... B60L 58/12 429/50 |

(Continued)

OTHER PUBLICATIONS

Ahmed et al.; "Enabling fast charging—A battery technology gap assessment"; J. Power Sources 367 (2017); 250-262.

(Continued)

Primary Examiner — Jimmy Vo
(74) Attorney, Agent, or Firm — Bachmann Law Group PC

(57) ABSTRACT

A multiple particle reduced order model to adjust charging applied to a load based on accurately predicting lithium plating potential in real time during the life of a lithium battery cell. In the current multi-particle reduced order modeling system, the current density and the potential distributions are solved iteratively. Once the current distribution is solved, lithium concentration distribution is solved without involving any iterative process. By solving the lithium concentration distribution as a separate step after the iteratively determined current density and potential distributions, the computation time required by the model to generate an output is dramatically reduced by avoiding solving multiple partial derivative equations iteratively. Based on the potential distribution information provided by the output of the model, lithium plating potential can be determined, and actions can be taken, such as modified charging techniques and rates, to minimize future lithium plating.

20 Claims, 11 Drawing Sheets

(56) References Cited

U.S. PATENT DOCUMENTS

| 2016/0023569 | A1* | 1/2016 | Lee | B60L 11/1861 |
| | | | | 429/50 |
| 2017/0190262 | A1 | 7/2017 | Jin et al. | |
| 2017/0203654 | A1 | 7/2017 | He et al. | |
| 2017/0234930 | A1 | 8/2017 | Lee et al. | |
| 2019/0113577 | A1 | 4/2019 | Severson et al. | |

OTHER PUBLICATIONS

Domenico et al.; "Lithium-Ion Battery State of Charge and Critical Surface Charge Estimation Using an Electrochemical Model-Based Extended Kalman Filter"; J. Dynamic Systems, Measurement, and Control 132 (6) 2010, 061302-01 to 061302-11.

Li et al.; "A single particle model with chemical/mechanical degradation physics for lithium ion battery State of Health (SOH) estimation"; Appl. Energy (2018) 1178-1190.

Perkins, Roger D., Alfred V. Randall, Xiangchun Zhang, and Gregory L. Plett. "Controls oriented reduced order modeling of lithium deposition on overcharge." Journal of Power Sources209 (2012): 318-325. (Year: 2012).

Remmlinger, Jurgen, Simon Tippmann, Michael Buchholz, and Klaus Dietmayer. "Low-temperature charging of lithium-ion cells Part II: Model reduction and application." Journal of Power Sources 254 (2014): 268-276. (Year: 2014).

Stetzel et al.; "Electrochemical state and internal variables estimation using a reduced-order physics-based model of a lithium-ion cell and an extended Kalman filter"; J. Power Sources 278 (2015) 490-505.

Tippmann, Simon, Daniel Walper, Luis Balboa, Bernd Spier, and Wolfgang G. Bessler. "Low-temperature charging of lithium-ion cells part I: Electrochemical modeling and experimental investigation of degradation behavior." Journal of Power Sources 252 (2014): 305-316. (Year: 2014).

* cited by examiner

CONTINUOUS DERATING FAST CHARGING METHOD BASED ON MULTIPLE PARTICLE REDUCED ORDER MODEL

BACKGROUND

Lithium batteries are used in many modern devices, including electric vehicles, computers, and cell phones. One attractive aspect of lithium-ion batteries is that they may be fast charged at a quicker rate than other rechargeable batteries. Fast charging does, however, have disadvantages. For example, fast charging can cause an accelerated capacity fading, resulting in the possibility of triggering a safety issue. During fast charging, lithium-ions tend to plate on the negative active material surface instead of intercalating into the material. Once lithium ions are plated, the lithium-ion battery degrades in several ways, including but not limited to creating an electrical pathway between the active material and the electrolyte through a solid electrolyte interface (SEI), exposing electrons to the electrolyte.

To minimize lithium metal plating, battery cells have been subject to extensive lithium plating tests to determine the maximum region and continuous charging current limits as a function of a state of charge (SOC) and temperature. However, practical models that are usable in real time and provide accurate results are not available by systems and processes of the prior art.

SUMMARY

The present technology, roughly described, utilizes a multiple particle reduced order model to adjust charging applied to a load based on accurately predict lithium plating potential in real time during the life of a lithium battery cell. The battery model can be based on several observations and assumptions, such as for example that cell voltage protection with a single particle reduced order model is accurate for a low or pulsing electrical load when a lithium concentration and potential gradient inside a cell is negligible. In the current multi-particle reduced order modeling system, only the current density and the potential distributions are solved iteratively. This is based on a premise that the electrical field and the charge transfer action processes occur at a smaller timescale than the diffusion timescale.

In embodiments, a method is disclosed for derating a charging current based on a modeled battery cell. The method may include setting a lithium ion concentration for a model battery by a battery management system on a battery-powered system. An initial charging current is applied to the battery cell. The battery model can provide a model for the battery cell on the battery-powered system. Material properties for the model battery can be set based at least in part on the modeled battery temperature. The potential distribution and current density for the model battery can be iteratively determined by the battery management system. A lithium plating potential for the model battery can then be calculated by the battery management system based at least in part on the potential distribution. The charging current is updated for the battery cell based on the lithium plating potential for the model battery In embodiments, a non-transitory computer readable storage medium includes a program, the program being executable by a processor to perform a method for derating a charging current based on a modeled battery cell. The method may include setting a lithium ion concentration for a model battery by a battery management system on a battery-powered system. The battery model can provide a model for the battery cell on the battery-powered system. An initial charging current is applied to the battery cell. Material properties for the model battery can be set based at least in part on the modeled battery temperature. The potential distribution and current density for the model battery can be iteratively determined by the battery management system. A lithium plating potential for the model battery can then be calculated by the battery management system based at least in part on the potential distribution. The charging current is updated for the battery cell based on the lithium plating potential for the model battery In embodiments, a system for derating a charging current based on a modeled battery cell includes one or more processors, memory, and one or more modules stored in memory and executable by the one or more processors. When executed, the modules may set a lithium ion concentration for a modeled battery by a battery management system on a battery powered system, the battery model providing a model for a battery cell on the battery powered system, applying an initial charging current to the battery cell, set material properties for the modeled battery based at least in part on the modeled battery temperature, iteratively determine potential distribution and current density for the modeled battery by the battery management system, calculate a lithium plating potential for the modeled battery by the battery management system based at least in part on the potential distribution, and updating the charging current for the battery cell based on the lithium plating potential for the model battery

DETAILED DESCRIPTION

Figure 1:
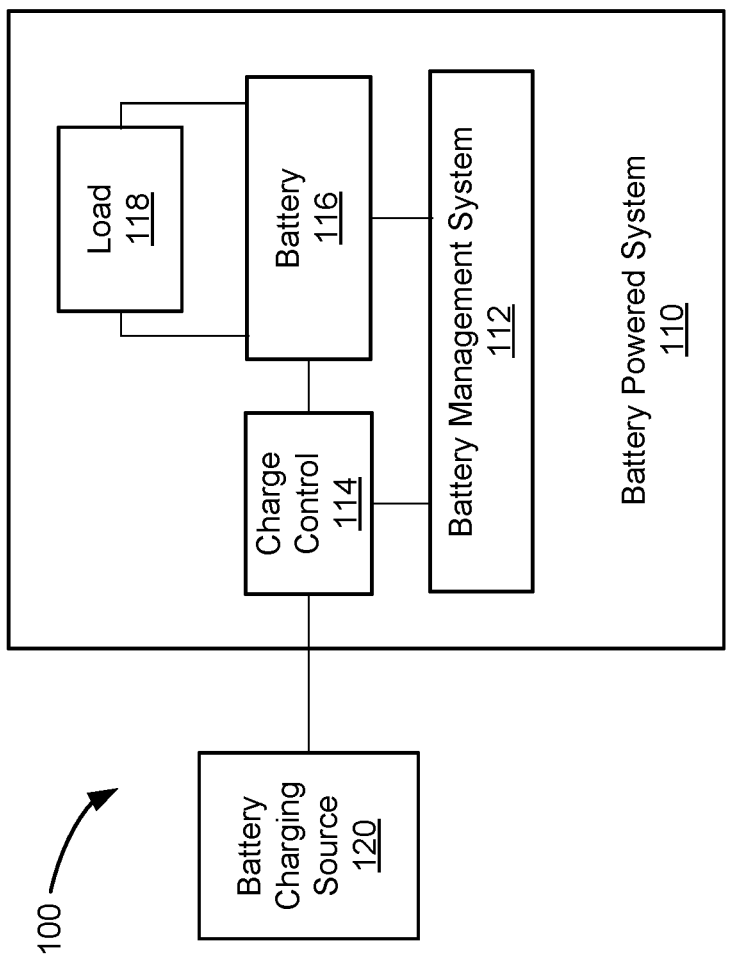
FIG. 1 is a block diagram of a battery powered system.

The present technology, roughly described, utilizes a multiple particle reduced order model to accurately predict lithium plating potential in real time during the life of a lithium battery cell. The battery model can be based on several observations and assumptions, such as for example that cell voltage protection with a single particle reduced order model is accurate for a low or pulsing electrical load when a lithium concentration and potential gradient inside a cell is negligible. Under a continuous electrical load such as during charging, however, the single particle model prediction will start to deviate from the measurement. This is due to the model being forced to use the average current density in the calculation.

In a full order model, the current density distribution, potential distribution such as the electrode potential and electrolyte potential, and the lithium concentration distribution are mutually dependent. Because the model is highly nonlinear, the model solution needs to be solved iteratively. In the current multi-particle reduced order modeling system, only the current density and the potential distributions are solved iteratively. This is based on a premise that the electrical field and the charge transfer action processes occur at a smaller timescale than the diffusion timescale.

Once the current distribution is solved, lithium concentration distribution is solved without involving any iterative process. By solving the lithium concentration distribution as a separate step after the iteratively determined current density and potential distributions, the computation time required by the model to generate an output is dramatically reduced by avoiding solving multiple partial differential equations iteratively. The accuracy of potential distribution within a cell is significantly improved compared to a single particle base model. Based on the potential distribution information provided by the output of the model, lithium plating potential can be determined, and actions can be taken, such as modified charging techniques and rates, to minimize future lithium plating.

The modeling technique of the present technology provides advantages over other modeling techniques and that it provides accurate results and can be implemented in real time, for example on a battery-powered system such as an electric vehicle, computer, mobile phone, or other device. Real-time applications of a physics-based model by prior systems are limited due to the high computational cost. In a lithium-ion battery cell model, many particles are considered to represent an electrode to capture current density and potential distribution inside the battery cell. The process of modeling is computationally intensive as it involves iteratively solving many partial differential equations. To reduce computation time for real-time application, a common model reduction scheme is to consider a single particle to represent an electrode. In some and set of solving multiple partial differential equations at each discrete time step, only a single partial differential equation needs to be solved with a single particle model. With this approach, however, the accuracy is poor because it cannot capture spatial dependent current density distribution. Any reliance on such a model to detect and avoid lithium plating will lead to erroneous results.

The technical problem addressed by the present technology relates to identifying degradation in batteries by modeling a battery cell. In some prior solutions degradation in batteries, such as lithium plating, is determined by modeling the battery. To provide an accurate model, a battery is modeled using multiple particles to represent each electrode. Though the typical a full-order pseudo-2-dimensional Li-ion cell model can provide accurate results, it requires large computational resources, cannot provide results in real time, and is not practical for use in consumer systems. Common reduced-order models represent electrodes as a single particle rather than multiple particles, and require much less computational cost. A single particle electrode model, however, has the disadvantage of not providing very accurate results, which can lead to incorrect lithium plating detection and prediction.

The present technology provides a technical solution to the technical problem of modeling a battery cell in real time so that the model can be used by a battery powered system with the battery being modeled. The battery cell model of the present technology provides a multi-particle reduced order model that iteratively determines the current density and potential distribution, and then determines a lithium plating potential as a separate non-iterative step after the iterative process is done. By determining the lithium plating potential as a separate step after the iterative process, a very large computational cost is avoided, which provides a more efficient computational process for implementing the lithium battery model. Further, by providing a model that addresses multiple particle electrodes rather than representing each electrode as a single particle, the model is much more accurate than models representing electrodes as single particles, providing a much more reliable lithium plating potential determination.

FIG. 1 is a block diagram of a battery powered system 100. Battery powered system 100 includes battery-powered system 110 and battery charging source 120. Each of systems 110—and 120 may be coupled with and communicate over one or more networks, including but not limited to public networks, private networks, cellular networks, wireless networks, the Internet, an intranet, a WAN, a LAN, a BLUETOOTH or other radio frequency signal, a plain-old-telephone-service (POTS), and/or any other network suitable for communicating digital and/or analog data over.

The elements illustrated in FIG. 1 are depicted in a manner and organization intended to be exemplary, and are not intended to be limiting. For example, battery charging source 120 and battery powered system 110 may each be implemented as one or more machines, servers, logical machines or servers, and may be separately implemented from or completely and/or partially combined with each other.

The data processing discussed herein is also discussed in a manner and organization intended to be exemplary, and it not intended to be limiting. For example, although an exemplary process is described in which data is retrieved from a battery 116 and processed by battery management system 112, the data may be retrieved by, processed in whole or in part, and transmitted in raw or processed form between different machines, servers and systems, modules and submodules, whether or not illustrated in FIG. 1.

Battery-powered system 110 may implement a system or product that utilizes a battery. Examples of a battery-powered system 110 include an electronic vehicle, mobile phone, computer, or some other device that utilizes a battery. Battery-powered system 110 includes battery management system 112, charge control 114, battery 116, and load 118. Battery-powered system 110 may receive a charge for battery 116 from battery charging source 120. The charge provided by source 120 may be received by charge control 114, which may then apply the charge the battery 116. In some instances, charge control 114 may communicate with battery management system 112 regarding how to apply a charge to better 116. For example, battery management system 112 may specify to charge control 114 a C-rate at which battery 116 may be charged, including the voltage and current at which to charge the battery 116. Battery management system may determine the voltage and current at which battery 116 should be charged based on a default voltage and current or customize voltage and current based on battery conditions detected or determined to exist by battery modeling. Load 118 may include one or more loads internal to or external to battery-powered system 110 to which battery 116 is to provide power. More details for battery 116 are discussed with respect to FIGS. 2-4.

BMS 112 may be implemented as hardware and/or software that controls and measures batter 114, and controls charging of battery 114 on system 110. BMS may include logic, modules, and components to provide a multiple particle reduce order model of battery 116. The battery model may be used to determine lithium plating potential in real time such that lithium plating in battery 116 can be detected and steps may be taken to reduce any such plating in the future. More detail for BMS 112 are discussed with respect to FIG. 5.

Battery charging source 120 may include any suitable source of charge for charging a battery 114. In some instances, in the case of a system 110 implemented as an electronic vehicle, battery charging source 120 may be a dealership, charging pump, or a power outlet commonly found in a home, business or other building. When system 110 is implemented as a phone or computer, a suitable battery charging source 120 may include a mobile charging pack, car charger, or power outlet found in a home, business or other building.

Figure 2:
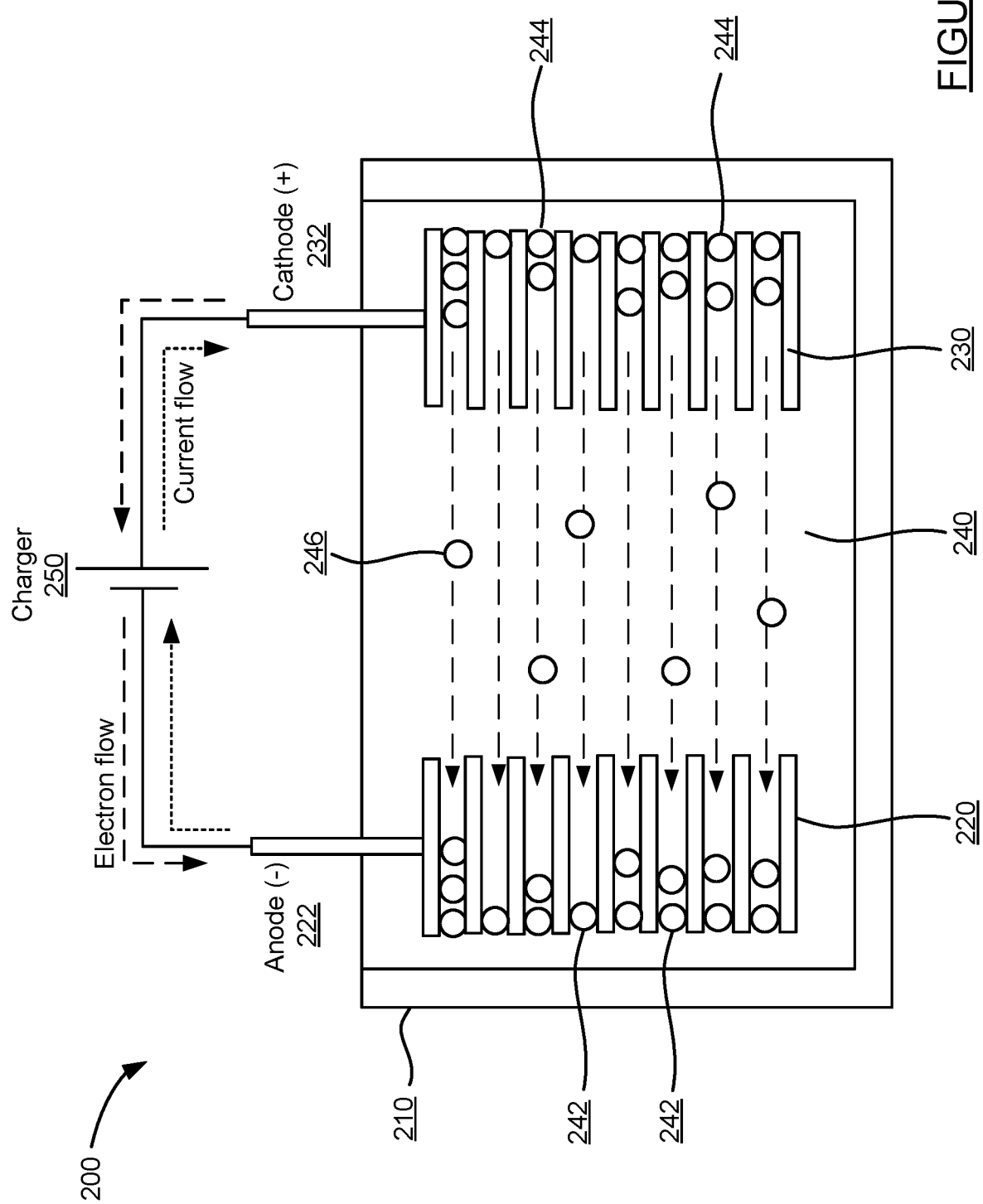
FIG. 2 is a block diagram of a lithium battery cell during charging.

FIG. 2 is a block diagram of a lithium battery cell 200 during charging. Battery cell 200 provides more detail of battery 116 in the system of FIG. 1. Battery cell 200 includes anode 222, cathode 232, lithium ions 242, 244, and 246, and electrolyte 240. The anode includes active material 220 and the cathode material includes active material 230. Electrolytes 240 are placed in a battery cell container 210 with the anode material 220 and cathode material 230. When the lithium battery is charged, charger 250 applies a potential between the anode and cathode. During charging, lithium ions 244 move from the positive cathode electrode 230 through the electrolyte (see lithium ions 246) and towards the negative anode electrode 220, where the lithium ions 242 are embedded into the anode via intercalation. The electrons travel from the cathode to the anode, causing current to travel from the anode to the electrode.

Figure 3:
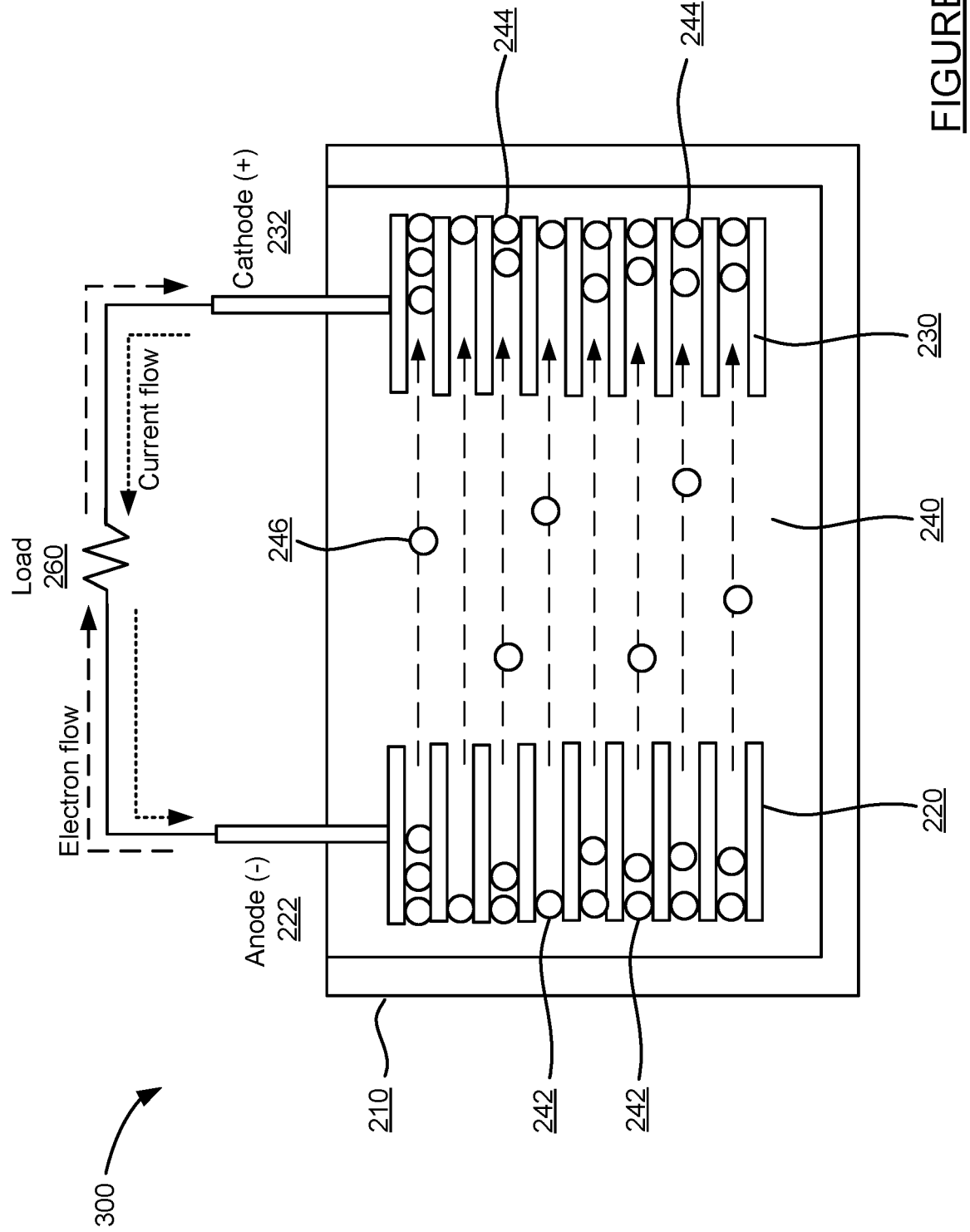
FIG. 3 is a block diagram of a lithium battery cell during discharge.

FIG. 3 is a block diagram of a lithium battery cell during discharge. During discharge, the lithium ions 242 collected at the anode move through the electrolyte (see lithium ions 246) to position at and within the cathode as lithium ions 244, resulting in a potential applied to load 260. During discharge, electrons travel from the anode to the cathode, causing current to travel from the cathode to the anode.

Figure 4:
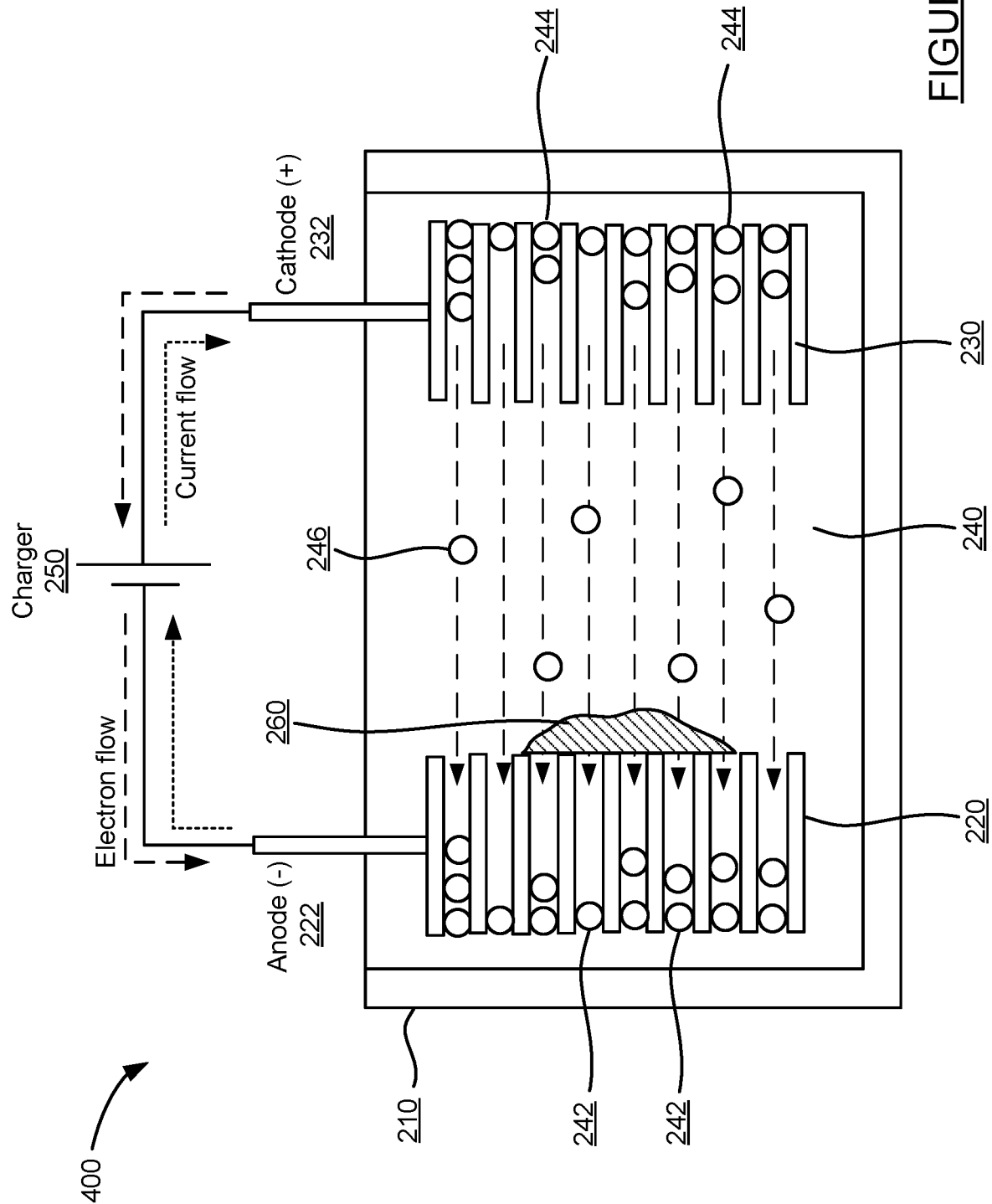
FIG. 4 is a block diagram of a lithium battery cell exhibiting lithium metal plating.

FIG. 4 is a block diagram of a lithium battery cell exhibiting lithium metal plating. During a charging process, lithium-ion batteries sometimes experience a phenomenon known as lithium metal plating. As lithium ions travel from a cathode to an anode, sometimes, due to the charge voltage or higher than desired temperatures, the lithium-ions arrive at the anode more quickly than the ions can intercalate within the anode structure. As a result, some lithium-ion's "plate" on the anode. The plated lithium ions 260 reduce intercalation of other ions within the anode, reduce the capacity of the cell, and can lead to other undesirable issues within a lithium battery.

Figure 5:
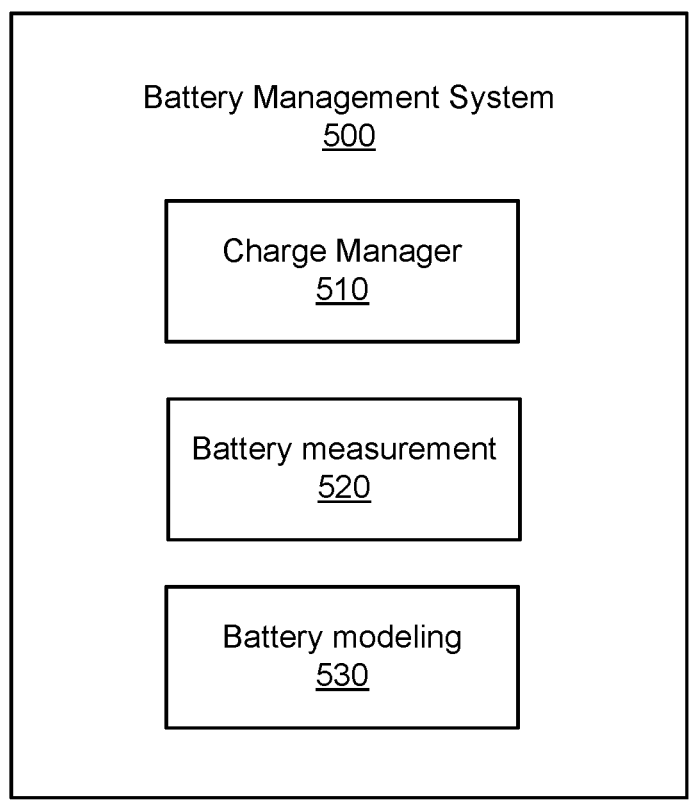
FIG. 5 is a block diagram of a battery management system.

FIG. 5 is a block diagram of a battery management system. Battery management system 500 of FIG. 5 includes a charge manager 510, battery management 520, and battery modeling 530. Charge manager 510 may control the voltage, current, duration, and other aspects of charging of a battery within a battery-powered system. Battery management 520 may measure aspects of the battery-powered system, the battery, a charge received from an outside source, and other aspects of the battery system of a battery-powered system.

Battery modeling 530 may model a battery 116 of a battery-powered system. The battery modeling may utilize a multi-particle reduce order model to provide accurate modeling for the battery within a system in real time. The battery model may receive inputs of applied electrical load and ambient temperature, and may output cell voltage, temperature, electric potential distribution including electrode potential lithium plating potential, and the concentration distribution inside the battery cell. The ambient temperature may be measured and provided, or in some instances may be predicted and then provided to the model. The prediction can involve, in some instances, thermal energy balancing techniques. Battery modeling 530 may iteratively determine a current density and potential distribution, and then use that information to determine the lithium plating potential. Battery modeling 530 may also communicate with charge manager 510 to indicate that lithium plating exists within the battery 116. In response, charge manager 510 may adjust a charging process of battery 116 to set a voltage and current during charge to minimize or eliminate further lithium plating. More detail for battery modeling 530 is discussed with respect to FIG. 6.

The elements of BMS 112 may be implemented as software modules stored in memory and executed by one or more processors, hardware components, or a combination of these. Further, the elements listed and BMS 112 are exemplary, and more or fewer elements may be implemented to perform the functionality described herein.

Figure 6:
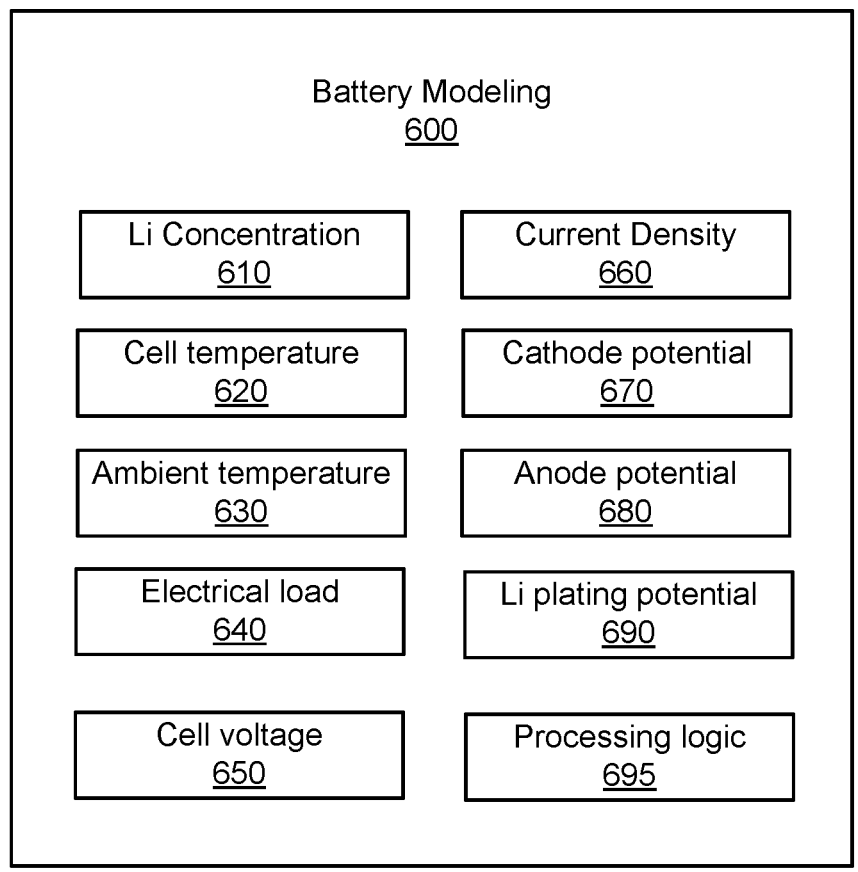
FIG. 6 is a block diagram of a battery modeling module.

FIG. 6 is a block diagram of a battery modeling module. Battery modeling module 600 generates, provides input to, and transmits the output from a multiple particle reduce order model used for modeling a battery 116 and determining lithium plating potential of battery 116. Battery modeling module 600 may include parameters for the model, material properties for battery materials, and processing logic which may include algorithms, iterative engines, and other logic for executing the model. As shown in FIG. 6, battery modeling module 600 may include parameters of lithium concentration 610, cell temperature 620, ambient temperature 630, electrical 640, cell voltage 650, current density 660, cathode potential 670, anode potential 680, lithium plating potential 690, and processing logic 695. Battery modeling module 600 may perform operations discussed herein associated with modeling a battery 116. The modules listed in battery modeling module 600 are exemplary, and more or fewer elements may be implemented to perform the functionality described herein.

Figure 7:
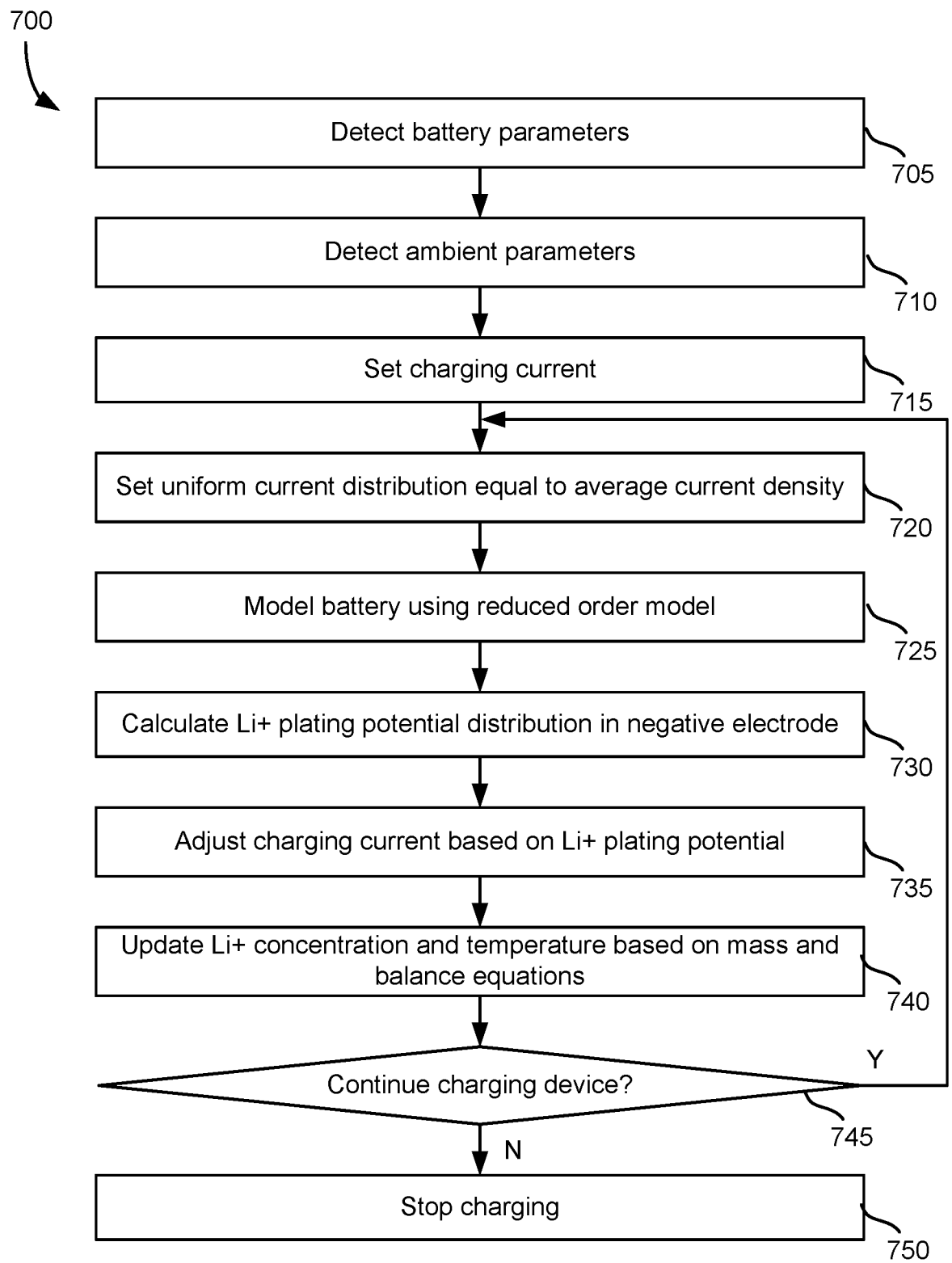
FIG. 7 is a method for continuous derating fast charging based on a multiparticle reduced order model.

FIG. 7 is a method for continuous derating fast charging based on a multiparticle reduced order model. First, battery parameters may be detected at step 705. In some instances, the detected battery parameters include an initial lithium ion concentration within the battery cell temperature, cell voltage, a state of charge, and battery property parameters. Battery property materials can include a diffusion coefficient, ion conductivity of electrolyte, electrical conductivity of electrodes and electrolyte, diffusion coefficient of electrolyte, diffusion coefficient of active material, and activity coefficient of electrolyte. Next, ambience parameters may be detected at step 710. Ambient parameters may include temperature and optionally other parameters.

A charging current may be set at step 715. The charging current may be set based on whether this is the first cycle for continuous derating fast charging or a subsequent cycle. Setting a charging current is discussed in more detail with respect to the method of FIG. 8.

A current distribution is set at step 720. The current distribution may be set as a uniform distribution, and may be set to equal the average current density. The current is applied to the battery terminals and, at least initially, the current across the cell cross section is assumed to be uniform.

A battery may be modeled using a reduced order model at step 725. The model may implement a multiple particle reduce order model, which saves considerable computational resources by iterating a current density and potential distribution iteratively, while determining a lithium plating potential as a separate step after the iterator process is complete. Modeling a battery using a reduced order model may include calculating a potential distribution, a surface over potential, calculating a new current distribution, and repeating the calculation steps until a convergence is reached. The reduced order model provides for modeling a multiple particle battery without requiring the resources of a full-scale physics-based models. Modeling a battery using a reduced order model is discussed in more detail with respect to FIG. 9.

A lithium ion plating potential distribution is calculated at step 730. The lithium ion plating potential distribution may be calculated within the negative electrode. The lithium plating potential can be calculated as follows:

$$\eta_{LP} = \varphi_s - \varphi_e - jR_{film},$$

wherein $\eta_{LP}$ is the Lithium ion plating potential, $\varphi_s$ is the solid electrode potential, $\varphi_e$ is the electrolyte potential, j is the charge current, and a resistance of a solid electrolyte interphase (SEI) film $R_{film}$ formed within the battery cell.

A charging current may then be adjusted based on the lithium ion plating potential at step 735. The charging current may be adjusted to extend the life of the battery based on whether the lithium ion plating potential is likely to indicate a presence or likelihood of lithium plating on the negative electrode. More details for adjusting a charging current based on the lithium ion plating potential are discussed with respect to the method of FIG. 10.

A lithium ion concentration and temperature are updated at step 740. In some instances, the concentration and temperature can be updated by solving mass balance and thermal energy balance equations. The mass balance equations and thermal energy balance equations can be expressed as shown below.

The mass balance in active materials can be expressed as:

$$r^2 \frac{\partial c_s}{\partial t} = \frac{\partial}{\partial r}\left(D_s r^2 \frac{\partial c_s}{\partial r}\right)$$

where $D_s$ (m²/s) is the diffusion coefficient of active material and $c_s$ (mol/m³) is the Li⁺ concentration in active materials.

The mass balance in electrolyte phase assuming a constant transference number, $t_+^0$, can be expressed as:

$$\frac{\partial \varepsilon_e c_e}{\partial t} = \frac{\partial}{\partial x}\left(D_e^{eff} \frac{\partial c_e}{\partial x}\right) + a_s(1 - t_+^0)j$$

where $\varepsilon_e$ (dimensionless) is porosity of electrodes and separator, $c_e$ (mol/m³) is the Li⁺ concentration in electrolyte phase, $D_e^{eff}$ is the effective Li⁺ diffusivity in electrolyte, $a_s$ (1/m) is the specific surface of electrodes, $t_+^0$ (dimensionless) is the cationic transference number with respect to electrolyte solvent, and j (mol/m²/s) is the molar flux.

Thermal energy balance can be determined as:

$$C_p \frac{\partial T}{\partial t} = \dot{Q}_{gen} + hA(T - T_{amb})$$

where $C_p$ (J/K) is the lumped-sum heat capacity of cell, T (K) is the cell temperature, $T_{amb}$ (K) is the ambient temperature, $Q_{gen}$ (W) is the heat being generated from a cell, and h (W/m²/K) is the heat transfer coefficient.

A determination is then made at step 745 as to whether charging of a device should continue. Charging should continue if the device is not yet fully charged or is not charged up to a desired level by a user of the battery device. If the device is not fully charged, the method of FIG. 7 returns to step 720 where the uniform current distribution is set to equal the average current density. If charging is complete, the method of FIG. 7 and at step 750.

By adjusting the charging of the battery based on the lithium ion plating potential at step 735, the charging of the battery is adjusted to increase the health and life cycle of the battery—by reducing lithium ion plating—on a time cycle basis rather than based on a particular state of charge (SOC) point for the battery. In this manner, the battery health is updated based on the particular properties of the battery itself rather than a pre-determined SOC look-up table.

Figure 8:
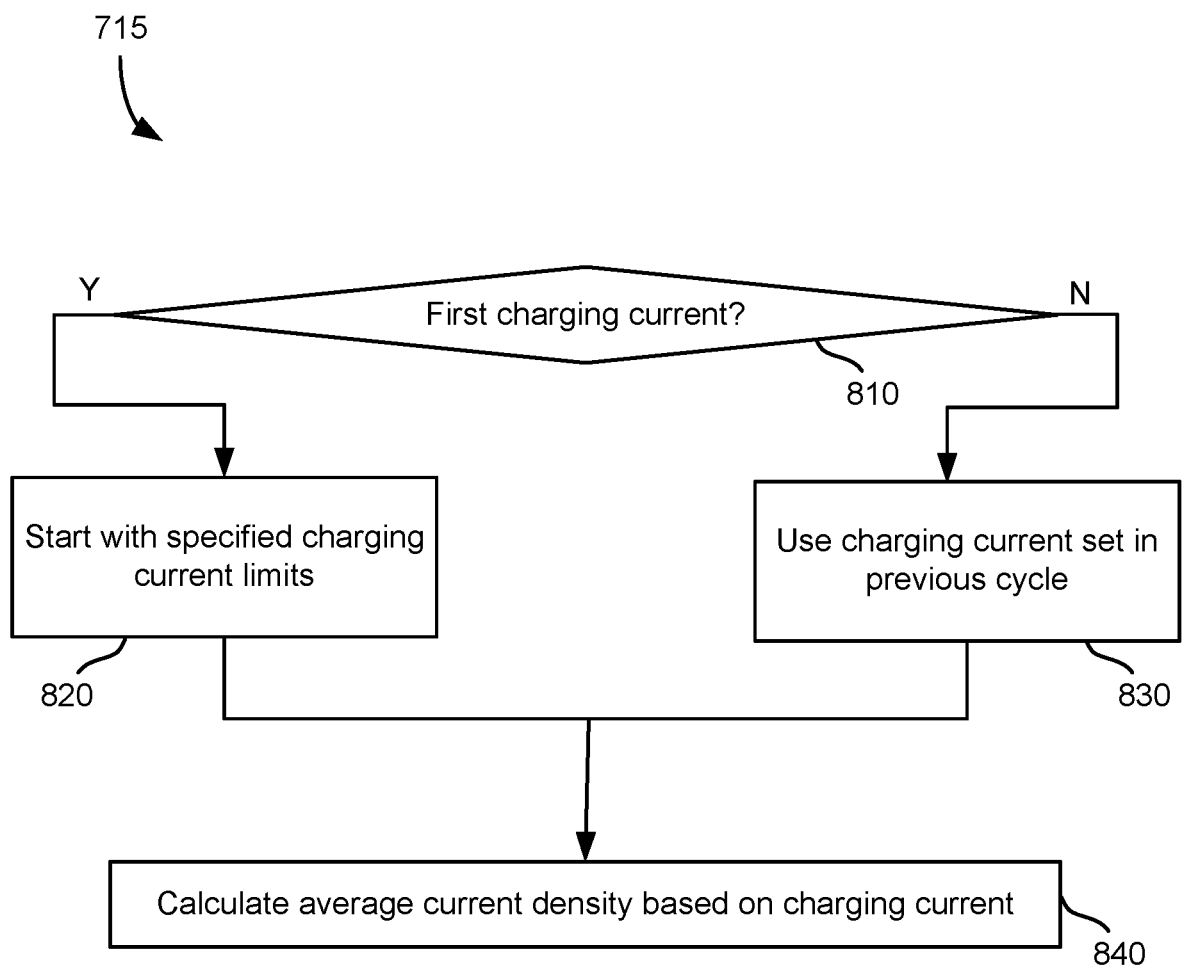
FIG. 8 is a method for setting a charging current for continuous derating fast charging method.

FIG. 8 is a method for setting a charging current for continuous derating fast charging method. The method of FIG. 8 provides more detail for step 715 of the method of FIG. 7. First, a determination is made as to whether a charging current is applied for the first time at step 810. If this is the first cycle of the method of FIG. 7, then a specified charging current limits is set at step 820. The specified charging current limits may be based on historical data for the particular battery. For example, the specified charge current may be found from a look-up table that is set for the particular battery type being charged, given a state of charge (SOC) and temperature for the battery. In some instances, the specified charge current can be the maximum C-rate for the battery having the particular SOC and temperature. If the charging current is not been applied for the first time, and a cycle of one or more steps of FIG. 7 has already occurred, the charging current said in the previous iteration of the method 700 of FIG. 7 is set as a current charging current at step 830. Once a current is set at step 820 or 830, the average current density is calculated at step 840. The average current density may be calculated by dividing the charge current by the electrode projected area.

Figure 9:
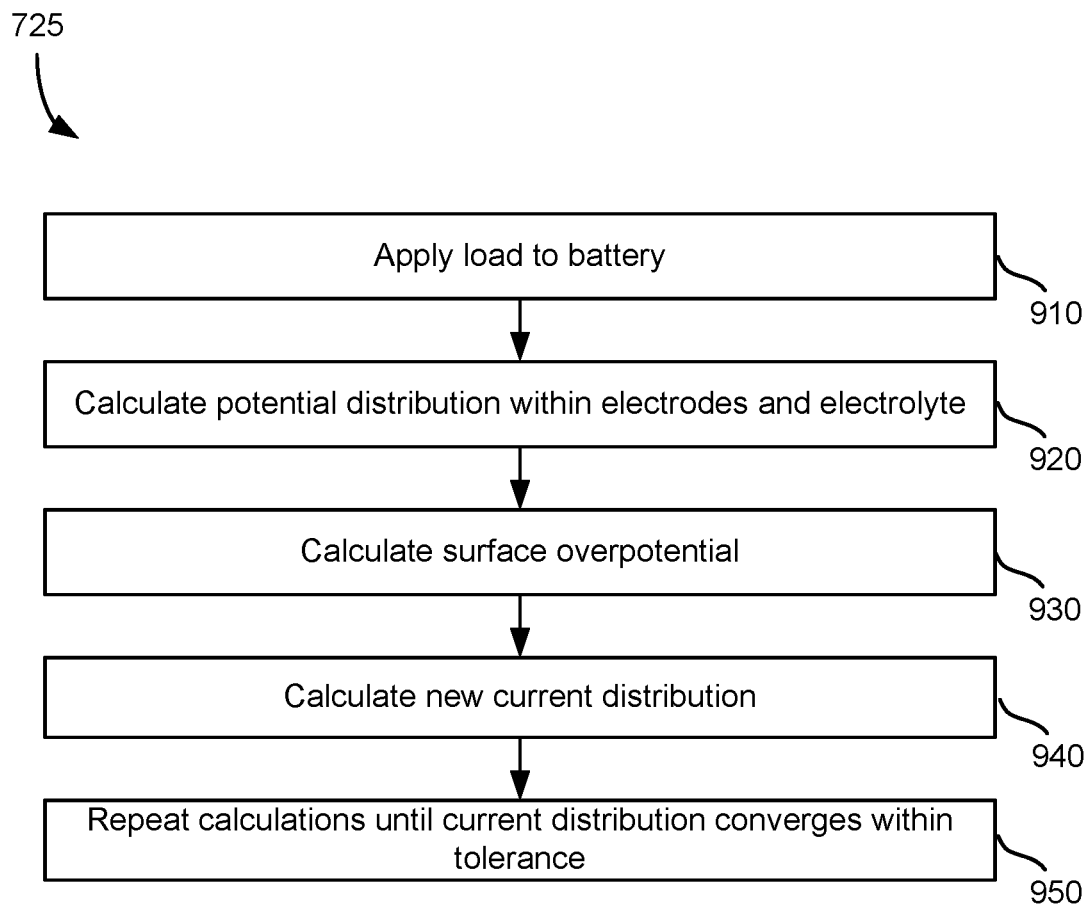
FIG. 9 is a method for modeling a battery using a reduced order model.

FIG. 9 is a method for modeling a battery using a reduced order model. The method of FIG. 9 provides more detail for step 725 the method of FIG. 7. A prescribed electrical load and ambient temperature are applied to the load of the battery model at step 910. Per step 720 of FIG. 7, the average current density can be applied in each electrode per the load. The load is determined by an actual load 118 applied to actual battery 116 in the system of FIG. 1

The potential distribution within the electrodes and electrolyte is calculated at step 920. The potential distribution may be calculated by solving a charge balance equation in both electrodes and electrolyte, given the current density. In some instances, the potential distribution and electrolyte domains can also be calculated by solving the charge balance equations. The potential distributions may be calculated based at least in part on the current density distribution.

A charge balance equation for an electrode can be provided as:

$$j(x) = \nabla(\sigma \nabla \varphi_s).$$

A charge balance equation for an electrolyte can be provided as:

$$j(x) = \nabla(K^{eff} \nabla \varphi_e) - \nabla\left(K_D^{eff} \frac{\partial \ln Ce}{\partial x}\right)$$

The potential distribution for the electrode $\varphi_s$ and potential distribution for the electrolyte $\varphi_e$ can be obtained by solving the two equations above (charge balance equation for electrode and charge balance equation for electrolyte), given a current density, j (a/m³).

A new surface over potential is calculated at step 930. The new surface over potential maybe based at least in part on the calculated potential distribution calculated at step 920. The surface potential can be provided as:

$$\eta = \varphi_s - \varphi_e - iR_{film},$$

A new current distribution may be calculated at step 940. The new current distribution may be calculated at least in part on an updated surface over potential. In some instances, the new current distribution is calculated based on the surface over potential to a reaction kinetics governing equation, for example based on Butler-Volmer reaction kinetics equations as:

$$j = a_s i_o \left\{ \exp\left(\frac{\alpha_c F}{RT}\eta\right) - \exp\left(-\frac{\alpha_c F}{RT}\eta\right) \right\}$$

The calculation steps are repeated until a current distribution converges within a tolerance at step 950. The tolerance may be close to zero (0.0), such that the new current distribution determined at step 940 is close or equal to the potential distribution determined at step 920. In some instances, the tolerance between the current distributions at step 920 and 940 may be 0.1% or lower. In all instances, for each iteration, the average of calculated current density within each electrode must be equal to the average applied current density calculated at step 940. When repeating the calculations, the new current distribution determined at step 940 is substituted into the calculations for the potential distribution within electrodes at step 920.

Figure 10:
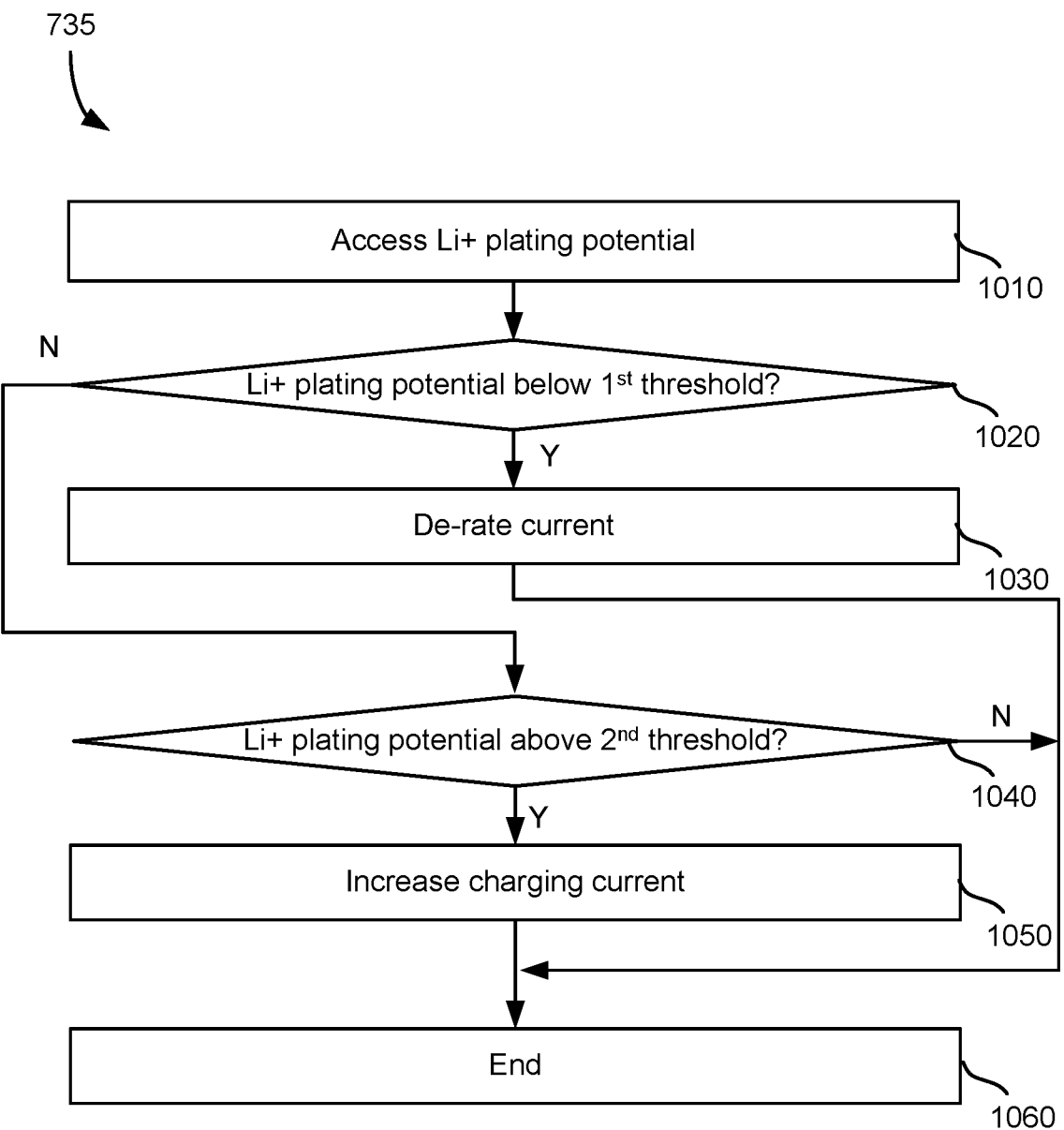
FIG. 10 is a method for adjusting a charging current based on a lithium ion plating potential.

FIG. 10 is a method for adjusting a charging current based on a lithium ion plating potential. The method of FIG. 10 provides more detail for step 735 of the method of FIG. 7. First, a lithium ion plating potential $\eta_{LP}$ is accessed at step 1010. Next, a determination is made as to whether the lithium ion plating potential is below a first threshold at step 1020. If the plane potential is below the first threshold or lower threshold, the current may be de-rated at step 1030. In some instances, the current may be de-rated by a specified derating factor. For example, a derating factor may cause a charging current to be reduced by 1% of its current charge rate. After derating the current, the method of FIG. 10 continues to step 1060.

If the plane potential is not below the first threshold, a determination is made as to whether the lithium ion plating potential is above a second or upper threshold at step 1040. If the plane potential is not above the second threshold, the method of FIG. 10 continues to step 1060. If the lithium ion plating potential is above a second threshold, the charging current is increased at step 1050. The charging current can be increased at step 1050 by a specified threshold. The charging current can be increased until lithium ion plating potential reaches a specified threshold value.

Figure 11:
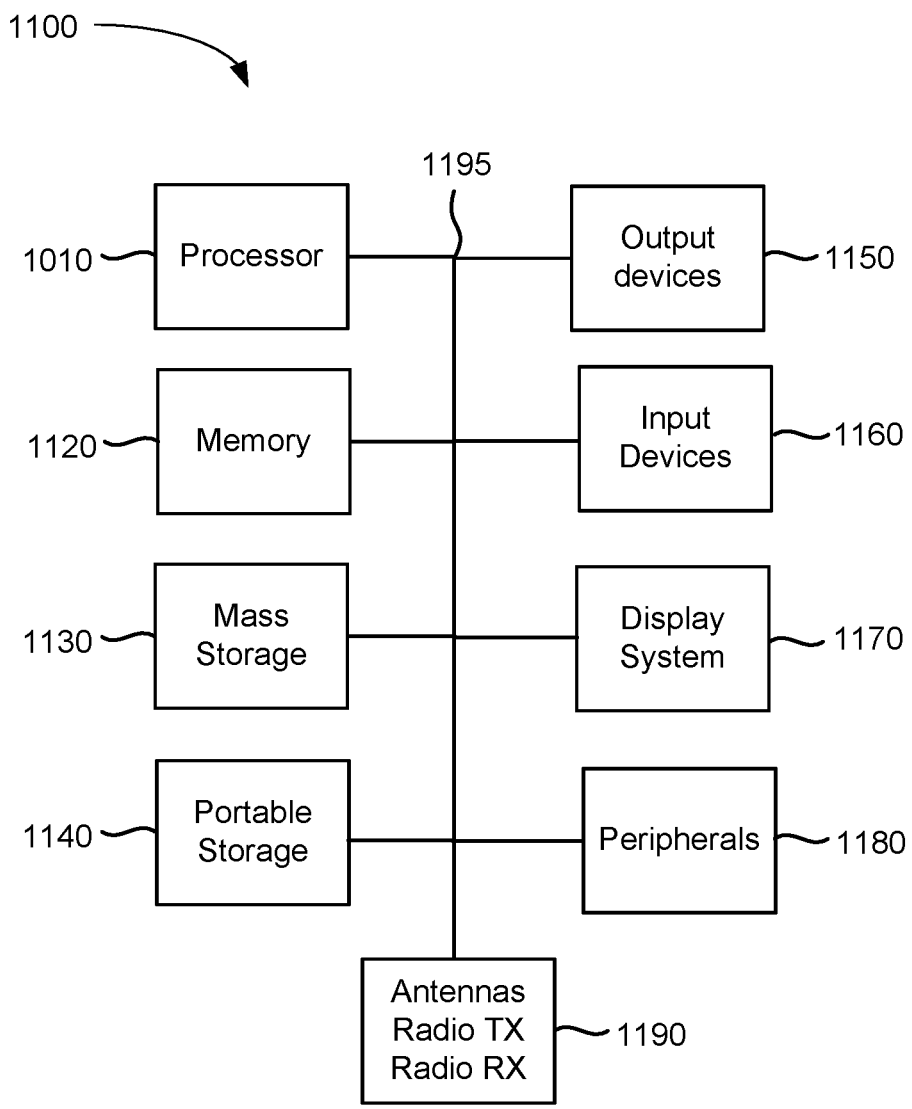
FIG. 11 is a block diagram of a computing environment for implementing in the present technology.

FIG. 11 is a block diagram of a computing environment for implementing in the present technology. System 1100 of FIG. 11 may be implemented in the contexts of the likes of machines that implement battery charging source 120 and battery powered system 110. The computing system 1100 of FIG. 11 includes one or more processors 1110 and memory 1120. Main memory 1120 stores, in part, instructions and data for execution by processor 1110. Main memory 1120 can store the executable code when in operation. The system 1100 of FIG. 11 further includes a mass storage device 1130, portable storage medium drive(s) 1140, output devices 1150, user input devices 1160, a graphics display 1170, and peripheral devices 1180.

The components shown in FIG. 11 are depicted as being connected via a single bus 1190. However, the components may be connected through one or more data transport means. For example, processor unit 1110 and main memory 1120 may be connected via a local microprocessor bus, and the mass storage device 1130, peripheral device(s) 1180, portable storage device 1140, and display system 1170 may be connected via one or more input/output (I/O) buses.

Mass storage device 1130, which may be implemented with a magnetic disk drive, an optical disk drive, a flash drive, or other device, is a non-volatile storage device for storing data and instructions for use by processor unit 1110. Mass storage device 1130 can store the system software for implementing embodiments of the present invention for purposes of loading that software into main memory 1120.

Portable storage device 1140 operates in conjunction with a portable non-volatile storage medium, such as a floppy disk, compact disk or Digital video disc, USB drive, memory card or stick, or other portable or removable memory, to input and output data and code to and from the computer system 1100 of FIG. 11. The system software for implementing embodiments of the present invention may be stored on such a portable medium and input to the computer system 1100 via the portable storage device 1140.

Input devices 1160 provide a portion of a user interface. Input devices 1160 may include an alpha-numeric keypad, such as a keyboard, for inputting alpha-numeric and other information, a pointing device such as a mouse, a trackball, stylus, cursor direction keys, microphone, touch-screen, accelerometer, and other input devices. Additionally, the system 1100 as shown in FIG. 11 includes output devices 1150. Examples of suitable output devices include speakers, printers, network interfaces, and monitors.

Display system 1170 may include a liquid crystal display (LCD) or other suitable display device. Display system 1170 receives textual and graphical information and processes the information for output to the display device. Display system 1170 may also receive input as a touch-screen.

Peripherals 1180 may include any type of computer support device to add additional functionality to the computer system. For example, peripheral device(s) 1180 may include a modem or a router, printer, and other device.

The system of 1100 may also include, in some implementations, antennas, radio transmitters and radio receivers 1190. The antennas and radios may be implemented in devices such as smart phones, tablets, and other devices that may communicate wirelessly. The one or more antennas may operate at one or more radio frequencies suitable to send and receive data over cellular networks, Wi-Fi networks, commercial device networks such as a Bluetooth device, and other radio frequency networks. The devices may include one or more radio transmitters and receivers for processing signals sent and received using the antennas.

The components contained in the computer system 1100 of FIG. 11 are those typically found in computer systems that may be suitable for use with embodiments of the present invention and are intended to represent a broad category of such computer components that are well known in the art. Thus, the computer system 1100 of FIG. 11 can be a personal computer, hand held computing device, smart phone, mobile computing device, workstation, server, minicomputer, mainframe computer, or any other computing device. The computer can also include different bus configurations, networked platforms, multi-processor platforms, etc. Various operating systems can be used including Unix, Linux, Windows, Macintosh OS, Android, as well as languages including Java, .NET, C, C++, Node.JS, and other suitable languages.

The foregoing detailed description of the technology herein has been presented for purposes of illustration and description. It is not intended to be exhaustive or to limit the technology to the precise form disclosed. Many modifications and variations are possible in light of the above teaching. The described embodiments were chosen to best explain the principles of the technology and its practical application to thereby enable others skilled in the art to best utilize the technology in various embodiments and with various modifications as are suited to the particular use contemplated. It is intended that the scope of the technology be defined by the claims appended hereto.

The invention claimed is:

1. A method for derating a charging current based on a modeled battery cell, comprising:
   setting a lithium ion concentration for a modeled battery by a battery management system on a battery powered system, the battery model providing a model for a battery cell on the battery powered system;
   applying an initial charging current to a battery cell;
   setting material properties for the modeled battery based at least in part on a modeled battery temperature;
   iteratively determining potential distribution and current density for the modeled battery by the battery management system; and
   calculating a lithium plating potential for the modeled battery by the battery management system based at least in part on the potential distribution; and
   updating the charging current for the battery cell based on the lithium plating potential for the model battery.

2. The method of claim 1, wherein updating the charging current includes decreasing the charging current if the lithium plating potential is less than zero.

3. The method of claim 1, wherein updating the charging current includes increasing the charging current if the lithium plating potential is greater than zero.

4. The method of claim 1, wherein the potential distribution and current density for the modeled battery is iteratively determined by the battery management system during cell life.

5. The method of claim 1, wherein setting material properties includes:
   estimating an actual lithium ion concentration in a battery cell within a battery powered system; and
   setting the estimated lithium ion concentration as the lithium ion concentration for the modeled battery.

6. The method of claim 1, wherein the modeled battery material properties are based at least in part on the set lithium ion concentration.

7. The method of claim 1, wherein the modeled battery material properties include a diffusion within particles and a diffusion within electrolytes.

8. The method of claim 1, wherein the modeled battery material properties include reaction rate constant and a conductivity within an electrolyte and an electrode.

9. The method of claim 1, wherein the potential distribution includes an electrode potential and an electrolyte potential.

10. The method of claim 1, wherein iteratively determining potential distribution and current density by the battery management system includes:
    setting an average applied current density for the modeled battery;
    calculating an electrolyte potential distribution and an electrode potential distribution for a cathode and an electrode the modeled battery;
    calculating a new local current distribution for the modeled battery; and
    repeating the steps of setting an average applied current density, calculating an electrolyte potential distribution and an electrode potential distribution, and calculating a new local current distribution for the modeled battery until the local current distribution converges.

11. A non-transitory computer readable storage medium having embodied thereon a program, the program being executable by a processor to perform a method for derating a charging current based on a modeled battery cell, the method comprising:
    setting a lithium ion concentration for a modeled battery by a battery management system on a battery powered system, the battery model providing a model for a battery cell on the battery powered system;
    applying an initial charging current to a battery cell;
    setting material properties for the modeled battery based at least in part on the modeled battery temperature;
    iteratively determining potential distribution and current density for the modeled battery by the battery management system; and
    calculating a lithium plating potential for the modeled battery by the battery management system based at least in part on the potential distribution; and
    updating the charging current for the battery cell based on the lithium plating potential for the model battery.

12. The non-transitory computer readable storage medium of claim 11, wherein updating the charging current includes decreasing the charging current if the lithium plating potential is less than zero.

13. The non-transitory computer readable storage medium of claim 11, wherein updating the charging current includes increasing the charging current if the lithium plating potential is greater than zero.

14. The non-transitory computer readable storage medium of claim 11, wherein the potential distribution and current density for the modeled battery is iteratively determined by the battery management system during cell life.

15. The non-transitory computer readable storage medium of claim 11, wherein setting material properties includes:
    estimating an actual lithium ion concentration in a batter cell within a battery powered system; and
    setting the estimated lithium ion concentration as the lithium ion concentration for the modeled battery.

16. The non-transitory computer readable storage medium of claim 11, wherein the potential distribution includes an electrode potential and an electrolyte potential.

17. The non-transitory computer readable storage medium of claim 11, wherein iteratively determining potential distribution and current density by the battery management system includes:

setting an average applied current density for the modeled battery;

calculating an electrolyte potential distribution and an electrode potential distribution for a cathode and an electrode the modeled battery;

calculating a new local current distribution for the modeled battery; and repeating the steps of Setting an average applied current density, calculating an electrolyte potential distribution and an electrode potential distribution, and calculating a new local current distribution for the modeled battery until the local current distribution converges.

18. A system for derating a charging current based on a modeled battery cell, comprising:

one or more processors, memory, and one or more modules stored in memory and executable by the one or more processors to set a lithium ion concentration for a modeled battery by a battery management system on a battery powered system, the battery model providing a model for a battery cell on the battery powered system, applying an initial charging current to a battery cell, set material properties for the modeled battery based at least in part on the modeled battery temperature, iteratively determine potential distribution and current density for the modeled battery by the battery management system, and calculate a lithium plating potential for the modeled battery by the battery management system based at least in part on the potential distribution, and update the charging current for the battery cell based on the lithium plating potential for the model battery.

19. The system of claim 18, wherein updating the charging current includes decreasing the charging current if the lithium plating potential is less than zero.

20. The method of claim 18, wherein updating the charging current includes increasing the charging current if the lithium plating potential is greater than zero.

* * * * *